US009920449B2

(12) United States Patent
Kusunoki et al.

(10) Patent No.: US 9,920,449 B2
(45) Date of Patent: Mar. 20, 2018

(54) PRODUCTION METHOD OF SIC SINGLE CRYSTAL

(71) Applicant: TOYOTA JIDOSHA KABUSHIKI KAISHA, Aichi (JP)

(72) Inventors: Kazuhiko Kusunoki, Nishinomiya (JP); Kazuhito Kamei, Kitakyushu (JP); Hironori Daikoku, Susono (JP); Hidemitsu Sakamoto, Susono (JP)

(73) Assignee: TOYOTA JIDOSHA KABUSHIKI KAISHA, Aichi (JP)

( * ) Notice: Subject to any disclaimer, the term of this patent is extended or adjusted under 35 U.S.C. 154(b) by 0 days.

(21) Appl. No.: 15/113,459

(22) PCT Filed: Feb. 12, 2015

(86) PCT No.: PCT/JP2015/000629
§ 371 (c)(1),
(2) Date: Jul. 22, 2016

(87) PCT Pub. No.: WO2015/122184
PCT Pub. Date: Aug. 20, 2015

(65) Prior Publication Data
US 2017/0009373 A1    Jan. 12, 2017

(30) Foreign Application Priority Data
Feb. 12, 2014    (JP) .................. 2014-024613

(51) Int. Cl.
*C30B 19/04*    (2006.01)
*C30B 29/36*    (2006.01)
(Continued)

(52) U.S. Cl.
CPC .............. *C30B 19/04* (2013.01); *C30B 9/06* (2013.01); *C30B 9/12* (2013.01); *C30B 19/062* (2013.01); *C30B 29/36* (2013.01)

(58) Field of Classification Search
CPC ......... C30B 29/36; C30B 19/00; C30B 19/12; C30B 19/068
See application file for complete search history.

(56) References Cited

U.S. PATENT DOCUMENTS

2014/0007807 A1* 1/2014 Daikoku ................. C30B 29/36
117/13
2014/0078707 A1* 3/2014 Wu ............................ H05K 7/14
361/807

(Continued)

FOREIGN PATENT DOCUMENTS

JP    2005-179080    7/2005
JP    2007-261843    10/2007
JP    2014-043365    3/2014

*Primary Examiner* — Robert M Kunemund
(74) *Attorney, Agent, or Firm* — Clark & Brody

(57) ABSTRACT

The production method of an SiC single crystal is a production method of an SiC single crystal by a solution growth process. The production method includes a contact step A, a contact step B, and a growth step. In the contact step A, a partial region of the principal surface is brought into contact with a stored Si—C solution. In the contact step B, a contact region between the principal surface and the stored Si—C solution expands, due to a wetting phenomenon, starting from an initial contact region which is the partial region brought into contact in the contact step A. In the growth step, an SiC single crystal is grown on the principal surface which is in contact with the stored Si—C solution.

4 Claims, 5 Drawing Sheets

(51) Int. Cl.
*C30B 9/12* (2006.01)
*C30B 19/06* (2006.01)
*C30B 9/06* (2006.01)

(56) References Cited

U.S. PATENT DOCUMENTS

| | | | | |
|---|---|---|---|---|
| 2014/0127466 A1* | 5/2014 | Danno | ............... | C30B 29/36 428/157 |
| 2015/0221511 A1* | 8/2015 | Kado | ............... | C30B 29/36 117/65 |

* cited by examiner

PRODUCTION METHOD OF SIC SINGLE CRYSTAL

TECHNICAL FIELD

The present invention relates to a production method of an SiC single crystal, and more particularly to a production method of an SiC single crystal by a solution growth process.

BACKGROUND ART

One method for producing an SiC single crystal is a solution growth process. In the solution growth process, a seed crystal is brought into contact with an Si—C solution to make an SiC single crystal grow on the seed crystal (see for example Patent Literature 1). The Si—C solution here refers to a solution in which C (carbon) is dissolved into a melt of Si or Si alloy. A seed crystal to be used for the solution growth process has generally a flat principal surface. The principal surface here refers to a dominant plane on which an SiC single crystal is to be grown. The seed crystal is disposed, for example, above the Si—C solution with the principal surface facing downward. Then, the principal surface is brought into contact with the liquid surface of the Si—C solution. Further, the seed crystal is put into a state in which only a vicinity of the principal surface is in contact with the Si—C solution, thereby making an SiC single crystal grow on the principal surface.

When an SiC single crystal is grown while only the vicinity of the principal surface of the seed crystal is in contact with the Si—C solution, the resulting SiC single crystal can be taken out without damaging it. Further, it is possible to suppress the formation of polycrystals. On the other hand, when an SiC single crystal is grown while the whole seed crystal is immersed in the Si—C solution, the aforementioned advantages will be hardly achieved. If, after the SiC single crystal is grown, the Si—C solution is caused to solidify with the whole seed crystal and the SiC single crystal that has grown thereon being immersed in the Si—C solution, the grown SiC single crystal may be subjected to stress due to shrinkage of the Si—C solution during solidification, thereby being broken. To avoid such a situation, it is conceivable that the seed crystal is immobilized at a shaft and immersed in the Si—C solution, thereby making an SiC single crystal grow. In this case, after the SiC single crystal is grown, the seed crystal and the SiC single crystal which has grown thereon can be taken out by lifting the shaft before the Si—C solution is solidified. For that reason, it is possible to suppress damage of the grown SiC single crystal. However, since polycrystalline SiC grows on the shaft in this method, the SiC crystal which grows on the seed crystal is likely to be polycrystallized.

CITATION LIST

Patent Literature

Patent Literature 1: Japanese Patent Application Publication No. 2007-261843

SUMMARY OF INVENTION

Technical Problem

When a principal surface of a seed crystal comes into contact with the liquid surface of an Si—C solution, atmospheric gas, for example, inert gas such as Ar (argon) and He (helium) may be captured as a bubble between the seed crystal and the Si—C solution. When the principal surface of the seed crystal is small (for example, a circle having a diameter of less than 2 inches (about 51 mm)), the distance between the bubble and an outer edge part of the principal surface is short. For that reason, the bubble is easily discharged from between the seed crystal and the Si—C solution. On the other hand, when the principal surface of the seed crystal is large (for example, a circle having a diameter of not less than 2 inches), the distance between the bubble and the outer edge part of the principal surface is long. For that reason, the bubble is more likely to remain between the seed crystal and the Si—C solution.

If the SiC single crystal grows under the presence of a bubble between the seed crystal and the Si—C solution, defects such as pores will occur in the SiC single crystal.

An objective of the present invention is to provide a production method of an SiC single crystal by a solution growth process in which bubbles are unlikely to get trapped between the seed crystal and the Si—C solution.

Solution to Problem

The production method of an SiC single crystal according to the present embodiment is a production method of an SiC single crystal by a solution growth process in which a principal surface of a seed crystal is arranged to face downward and brought into contact with an Si—C solution, thereby making an SiC single crystal grow on the principal surface. The principal surface is flat. This production method includes a contact step A, a contact step B, and a growth step. In the contact step A, a partial region of the principal surface is brought into contact with a stored Si—C solution. In the contact step B, a contact region between the principal surface and the stored Si—C solution expands, due to a wetting phenomenon, starting from an initial contact region which is the partial region brought into contact in the contact step A. In the growth step, an SiC single crystal is grown on the principal surface which is in contact with the stored Si—C solution.

Advantageous Effects of Invention

The production method of an SiC single crystal of the present embodiment can make it unlikely that bubbles get trapped between the seed crystal and the Si—C solution. As a result, it is possible to obtain an SiC single crystal containing no defect or reduced defects caused by bubbles.

DESCRIPTION OF EMBODIMENTS

Figure 1:
FIG. 1 is a photograph of the surface of an SiC crystal in which a depression having a diameter of about 0.3 mm is formed.

The production method of an SiC single crystal according to the present embodiment is a production method of an SiC single crystal by a solution growth process in which a principal surface of a seed crystal is arranged to face downward and brought into contact with an Si—C solution, thereby making an SiC single crystal grow on the principal surface. The principal surface is flat. This production method includes a contact step A, a contact step B, and a growth step. In the contact step A, a partial region of the principal surface is brought into contact with a stored Si—C solution. In the contact step B, the contact region between the principal surface and the stored Si—C solution expands, due to a wetting phenomenon, starting from an initial contact region which is the partial region brought into contact in the contact step A. In the growth step, an SiC single crystal is grown on the principal surface which is in contact with the stored Si—C solution.

Since the initial contact region is a part of the principal surface of the seed crystal, the contact area between the principal surface of the seed crystal and the Si—C solution is small in the contact step A. For this reason, bubbles are unlikely to get trapped between the seed crystal and the Si—C solution. Upon a partial region (initial contact region) of the principal surface being brought into contact with the stored Si—C solution, the contact region between the principal surface of the seed crystal and the stored Si—C solution expands due to a wetting phenomenon starting from the initial contact region (contact step B). At this moment, the atmospheric gas between the seed crystal and the Si—C solution is discharged sideward from between the seed crystal and the Si—C solution. Further, in the present embodiment, when the initial contact region of the principal surface and the stored Si—C solution come into contact with each other, the height of a center point of the principal surface differs from a maximum height of the liquid surface of the stored Si—C solution.

If only the initial contact region is brought into contact the stored Si—C solution, the contact region with the Si—C solution in the principal surface may not necessarily expand to the whole surface of the principal surface. In this case, at least one of the seed crystal and the stored Si—C solution may be moved such that the seed crystal and the stored Si—C solution come closer to each other. In this case, since the contact region with the Si—C solution in the principal surface expands from a part to the whole surface of the principal surface, bubbles are unlikely to get trapped between the principal surface and the stored Si—C solution.

Therefore, according to the production method of an SiC single crystal of the present embodiment, it is unlikely that bubbles get trapped between the seed crystal and the Si—C solution. As a result, it is possible to obtain an SiC single crystal containing no defect or reduced defects caused by bubbles.

The principal surface of the seed crystal is a dominant plane on which an SiC single crystal is to be grown. For this reason, in the production method of an SiC single crystal of the present embodiment, substantially, only a specific flat plane, that is, only a plane having one kind of plane orientation of the seed crystal can be made to be the crystal growth plane. For this reason, an SiC single crystal can uniformly be grown. As a result, it is possible to easily obtain an SiC single crystal having a width of not less than 2 inches.

The stored Si—C solution is accommodated, for example, in a crucible.

If the SiC single crystal is grown under the presence of a bubble between the Si—C solution and the seed crystal, defects as described below will be introduced into the SiC crystal. When the bubble is small (for example, a diameter of less than 0.1 mm), the bubble will be completely taken into the SiC single crystal. For that reason, the bubble is likely to become a closed pore in the grown SiC single crystal. A case in which the diameter of the bubble is larger than this will be described in the following.

FIG. 1 shows a photograph of the surface of an SiC crystal in which a depression having a diameter of about 0.3 mm is formed. The photograph of FIG. 1 shows the crystal growth plane taken from the front thereof.

It is considered that a bubble of a size corresponding to that of the depression is present between the seed crystal and the Si—C solution during the crystal growth of the SiC crystal shown in FIG. 1, and the portion in which the bubble is present has turned into the depression. There is a protruding part having a hexagonal shape at an edge part of the depression. It is considered that this protruding part is formed as a result of an SiC crystal preferentially growing in the direction along the interface between the bubble and the Si—C solution (direction parallel with the interface) during crystal growth. The reason why the protruding part has a hexagonal shape is considered to be a result of the crystal system (hexagonal crystal system) of the seed crystal, and the plane orientation ((0001) plane) of the crystal growth plane being reflected.

The SiC crystal shown in FIG. 1 has been grown at a rate of about 0.1 mm/hour. When the diameter of a bubble is not less than about 0.1 mm and the growth rate of crystal is not more than 0.2 mm/hour, it is considered that the SiC crystal tends to grow preferentially in a direction along the interface between the bubble and the Si—C solution.

Figure 2:
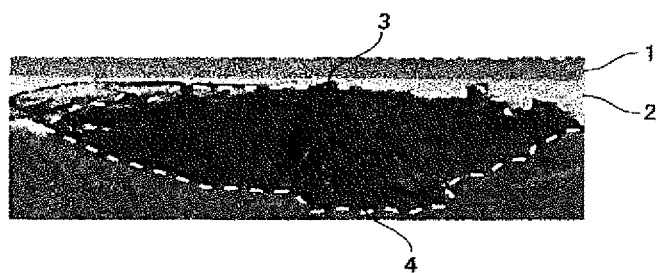
FIG. 2 is a sectional photograph of an SiC crystal including a void having a diameter of about 0.5 mm.

FIG. 2 shows a sectional photograph of an SiC crystal including a void having a diameter of about 0.5 mm. FIG. 2 shows a photograph of a section of the SiC crystal sectioned perpendicularly to the crystal growth plane.

In FIG. 2, a void 3 is present on the seed crystal 1. The SiC single crystal 2 has grown from a portion apart from the void 3 on the seed crystal 1. An SiC polycrystal 4 spreads from the void 3 in a direction along the seed crystal 1 and has grown to be thicker than the SiC single crystal 2. It is considered that a bubble of a size corresponding to that of the void is present between the seed crystal and the Si—C solution when the SiC crystal grows, and a portion where the bubble is present has turned into the void.

The growth rate of the SiC crystal shown in FIG. 2 is a growth rate of about 0.3 min/hour, and is larger than that of the SiC crystal of FIG. 1. It is considered that when the diameter of the bubble is not less than about 0.1 mm and the growth rate of crystal is larger than 0.2 mm/hour, the SiC crystal turns into polycrystals, and tends to grow in a direction apart from the interface between the bubble and the Si—C solution irrelevantly to the interface.

When the SiC crystal grows with a bubble taken therein, solutes (Si and C) of the Si—C solution in the vicinity of the bubble become unlikely to be consumed. As a result, the degree of supersaturation of the Si—C solution in the vicinity of the bubble increases. As the size of bubble increases, the degree of supersaturation of the Si—C solution present around the bubble increases. When the degree of supersaturation is low, the SiC crystal grows preferentially in a direction along the interface. However, when the size of bubble increases, and the degree of supersaturation increases to a certain level, the SiC crystal grows in a direction apart from the interface irrelevantly to the interface.

According to the production method of an SiC single crystal of the present embodiment, it is possible to suppress the induction of the above-described defects, that is, the induction of closed pores and depressions, as well as the polycrystallization.

In the production method of an SiC single crystal relating to an embodiment, the contact step A includes a step A-1*b* in which the principal surface is brought into contact with the stored Si—C solution, and thereafter the principal surface is detached from the stored Si—C solution, thereby leading to a state in which the Si—C solution adheres to a partial region of the principal surface. Further, the contact step A includes a step A-1*b* in which when the height of a center point of the principal surface is larger than a maximum height of the liquid surface of the stored Si—C solution, the Si—C solution having adhered to the partial region of the principal surface is brought into contact with the stored Si—C solution.

Step A-1*a* is carried out, for example, in a state in which the principal surface is horizontal (substantially orthogonal to the direction of gravity). In this case, right after the principal surface of the seed crystal is detached from the stored Si—C solution, the Si—C solution adheres to the whole surface of the principal surface as a thin liquid film. However, the adhered Si—C solution will soon gather into a part of the principal surface. Consequently, the Si—C solution having adhered to the principal surface protrudes from the principal surface in a partial region of the principal surface. No bubble will get trapped between the Si—C solution, which has gathered into a part of the principal surface, and the principal surface.

If step A-1*b* is carried out in this state, the Si—C solution having adhered to the principal surface and the stored Si—C solution are connected together. As a result, a partial region of the principal surface has come into contact with the stored Si—C solution via the Si—C solution protruding from the principal surface. The relevant partial region at this moment is an initial contact region. At this moment, the principal surface is located higher than the liquid surface of the stored Si—C solution by an amount of height to which the Si—C solution which has gathered to a part of the principal surface protrudes. Further, the contact region between the principal surface and the stored Si—C solution expands due to a wetting phenomenon, while discharging the atmospheric gas between the seed crystal and the stored Si—C solution. As a result, the Si—C solution comes into contact with the whole surface of the principal surface of the seed crystal without any bubble interposed therebetween.

In the production method of an SiC single crystal relating to another embodiment, the contact step A includes a step A-2*a* in which a solution contact member is brought into contact with the stored Si—C solution, thereby raising a portion in a vicinity of the solution contact member to be higher than other portions in the liquid surface of the stored Si—C solution. Further, the contact step A includes a step A-2*b* in which when the height of the center point of the principal surface is lower than the maximum height of the liquid surface of the stored Si—C solution, a partial region of the principal surface is brought into contact with the liquid surface of the Si—C solution which has been raised higher than other portions.

The solution contact member is, for example, bar-shaped. The solution contact member may be disposed on the side and in the vicinity of the seed crystal.

In a case in which the Si—C solution has high wettability against the solution contact member, upon contact of the solution contact member with the stored Si—C solution in step A-2*a*, the Si—C solution wets and spreads on the surface of the solution contact member from a region of first contact to a higher position due to a wetting phenomenon. As a result, the vicinity of the solution contact member is raised higher than other portions in the liquid surface of the stored Si—C solution.

The vicinity of the solution contact member may not necessarily be raised sufficiently higher than other portions in the liquid surface of the Si—C solution simply by the solution contact member coming into contact with the stored Si—C solution, such as when the wettability of the Si—C solution against the solution contact member is low. In this case, at least one of the solution contact member and the stored Si—C solution is moved such that the solution contact member and the stored Si—C solution are detached from each other while maintaining the contact between the solution contact member and the stored Si—C solution. As a result, the vicinity of the solution contact member is raised sufficiently higher than other potions in the liquid surface of the stored Si—C solution.

In step A-2*b*, a partial region (initial contact region) of the principal surface, specifically, a part of the edge part is brought into contact with a raised portion of the stored Si—C solution. At this moment, the center point of the principal surface is lower than the maximum height of the liquid surface of the stored Si—C solution. If a part of the edge part of the principal surface comes into contact with the Si—C solution, the contact region with Si—C solution in the principal surface expands due to a wetting phenomenon. At this moment, the atmospheric gas between the principal surface and the stored Si—C solution is discharged sideward. For this reason, the Si—C solution comes into contact with the whole surface of the principal surface of the seed crystal without any bubble interposed therebetween.

Further, in a production method of an SiC single crystal relating to another embodiment, the contact step A includes a step A-3 in which the principal surface is inclined with respect to a horizontal plane, and a partial region of the principal surface is brought into contact with the stored Si—C solution when the height of the center point of the principal surface is larger than the maximum height of the liquid surface of the stored Si—C solution. Further, the contact step includes a growth step in which the SiC single crystal is grown with the principal surface being kept horizontal.

Since when the stored Si—C solution stands still, the liquid surface of the Si—C solution is horizontal, the principal surface inclined with respect to the horizontal plane will first come into contact with the liquid surface of the Si—C solution at a part of its edge part. At this moment, the height of the center point of the principal surface is larger than the height of the liquid surface of the stored Si—C solution. When the inclination angle of the principal surface with respect to the horizontal plane is sufficiently small, thereafter, the contact region with the Si—C solution in the principal surface will expand from the part of the edge part (initial contact region) to the whole surface of the principal surface due to a wetting phenomenon. At this moment, since the atmospheric gas between the principal surface and the stored Si—C solution is discharged sideward, the Si—C solution comes into contact with the whole surface of the principal surface of the seed crystal without any bubble interposed therebetween. Further, the principal surface is returned to horizontal (a state of substantially orthogonal to the direction of gravity) to make the Si—C single crystal grow. As a result, even when a temperature gradient is formed in the up-and-down direction of the stored Si—C solution, the SiC single crystal grows uniformly.

Figure 3:
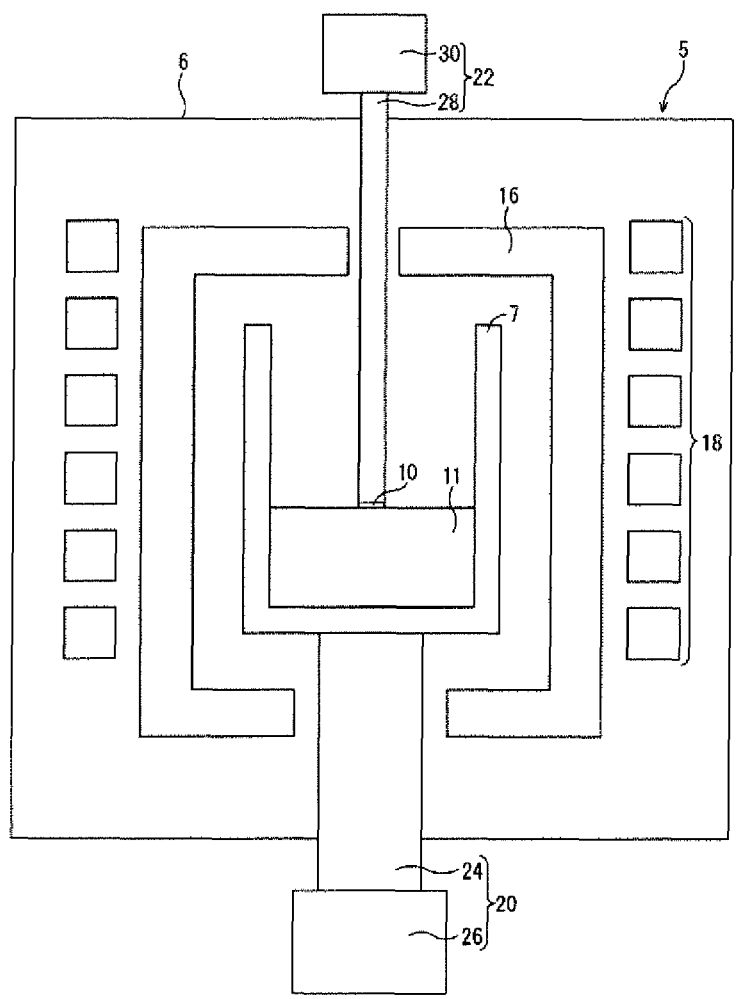
FIG. 3 is a schematic configuration diagram of a production apparatus which is usable for practicing the production method of an SiC single crystal of the present embodiment.

Next, with reference to the drawings, the production method of an SiC single crystal according to the present embodiment will be specifically described. FIG. 3 is a schematic configuration diagram of a production apparatus which is usable for practicing the production method of an SiC single crystal according to the present embodiment. As shown in FIG. 3, the production apparatus 5 includes a chamber 6, a crucible 7, a heat insulation member 16, a heating apparatus 18, a rotating apparatus 20, and a lift apparatus 22. The heat insulation member 16 is made up of a heat insulation material and surrounds the crucible 7.

The heating apparatus 18 surrounds a side wall of the heat insulation member 16. The heating apparatus 18 is, for example, a high frequency coil, and inductively heats the crucible 7. A raw material is liquefied in the crucible 7 and an Si—C solution 11 is generated. The Si—C solution 11 serves as the raw material of the SiC single crystal. The crucible 7, the heat insulation member 16, and the heating apparatus 18 are accommodated in the chamber 6.

The rotating apparatus 20 includes a rotating shaft 24 and a driving source 26. The upper end of the rotating shaft 24 is located within the heat insulation member 16. The crucible 7 is disposed at the upper end of the rotating shaft 24. The lower end of the rotating shaft 24 is located outside the chamber 6. The driving source 26 is disposed beneath the chamber 6. The driving source 26 is linked to the rotating shaft 24. The driving source 26 rotates the rotating shaft 24 around its central axis. As a result, the crucible 7 (Si—C solution 11) is rotated.

The lift apparatus 22 includes a seed shaft 28 and a driving source 30. The seed shaft 28 is dominantly made of for example, graphite. The upper end of the seed shaft 28 is located outside the chamber 6. A seed crystal 10 is attached under the seed shaft 28.

The driving source 30 is disposed above the chamber 6. The driving source 30 is linked to the seed shaft 28. The driving source 30 moves up and down the seed shaft 28. This makes it possible to bring the seed crystal 10 attached to the seed shaft 28 into contact with the liquid surface of the Si—C solution 11 accommodated in the crucible 7. The driving source 30 rotates the seed shaft 28 around its central axis. As a result, the seed crystal 10 attached to the seed shaft 28 is rotated. The rotational direction of the seed shaft 28 may be either the same as or opposite to the rotational direction of the crucible 7.

Next, the production method of an SiC single crystal by using the production apparatus 5 will be described.

First Embodiment

FIGS. 4A to 4D are side views to illustrate a production method of an SiC single crystal relating to a first embodiment.

In the production method of an SiC single crystal relating to the first embodiment, first, a seed crystal 10 having a flat plate shape (for example, a circular plate shape) is prepared. The seed crystal 10 is attached to, for example, a seed retaining part. The seed retaining part is, for example, a lower end part of the seed shaft 28 (see FIG. 3). The seed crystal 10 is, for example, immobilized to the under face of the seed shaft 28 with an adhesive. At this moment, one of the surfaces (hereafter, referred to as a "principal surface 10a") of the seed crystal 10 is arranged to face downward. The seed crystal 10 attached to the seed retaining part is disposed above the Si—C solution 11 accommodated (stored) in the crucible 7. The principal surface 10a, which is a dominant plane on which an SiC single crystal is to be grown, is flat. Even if a single crystal is grown on the side face (peripheral face) of the seed crystal 10 in addition to on the principal surface 10a, this side face is not a principal surface since it is not a dominant plane on which a single crystal is to be grown.

The Si—C solution 11 can be generated by generating, for example, a melt of Si, or a melt containing Si and one or more elements selected from the group consisting of Ti, Mn, Cr, Co, V, and Fe in a carbonaceous crucible (for example, a graphite crucible), and eluting C into the melt from the carbonaceous crucible. This method is preferable in that undissolved C which can be a nucleus for SiC precipitation is less likely to be supplied to the melt.

As an alternative method, there is a process by way of a gas phase, in which C is dissolved into the melt from a hydrocarbon gas. As a further method, there is a method of investing and dissolving a solid phase C source into the melt. As the solid phase carbon source, graphite in the form of a block, a bar, a granule, and a powder, etc., amorphous carbon materials, SiC, and carbides of additive elements, etc. can be used. The additive element is an element constituting the Si—C solution 11 excepting Si and C.

As the method of supplying C to the melt, two or more kinds of the above mentioned methods may be combined.

The temperature at which the Si—C solution 11 is generated may be any temperature provided that it is equal to or higher than the liquids temperature of Si or a mixture including Si, which is charged into the crucible. Heating is continued such that C is supplied to the melt until the SiC concentration in the melt reaches a saturated concentration or a concentration close to that. When a solid carbon source, particularly a carbon source in a powder or granular form is invested into the crucible 7, the carbon source may remain undissolved in the melt if heating is insufficient. In this case, SiC will precipitate with the undissolved carbon source as a nucleus. The precipitated SiC decreases the growth rate of the SiC single crystal. The precipitated SiC further deteriorates the quality of crystal. Therefore, the heating is preferably continued such that the supplied carbon source is fully dissolved. The heating time of the melt is generally about 1 to 10 hours.

When C is supplied to the melt from other than the crucible, any crucible made of a material which is stable in a growth temperature range of SiC crystal may be used. For example, a crucible made of a high melting-point metal, or a crucible made up of a graphite crucible which is lined with an appropriate refractory material may be used. Examples of the high melting-point metal include Ta, W, and Mo. Examples of the refractory material include the aforementioned high melting-point metals, or ceramics (for example, silicon carbide).

FIG. 3 shows an example of the production apparatus 5 using the crucible 7. However, a levitation method may also be used in which the raw material is floated and liquefied by electromagnetic force without using the crucible 7. As an alternative method, as long as a desired melt composition is realized, it is possible to adopt a cold crucible method in which a floated melt is generated by magnetic repulsion in a water-cooled metal crucible.

The seed crystal 10 may be, for example, an SiC single crystal obtained by a sublimation recrystallization method, or an SiC single crystal obtained by vapor deposition such as CVD (Chemical Vapor Deposition) method. The seed crystal 10 utilizes a crystal having the same crystal structure as that of the SiC single crystal which is to be grown.

The principal surface 10a of the seed crystal 10 is brought into contact with the Si—C solution 11 in which SiC is dissolved up to a saturated concentration, or a concentration close to that so that at least the Si—C solution 11 in the vicinity of the seed crystal 10 is supersaturated in SiC. As a result, an SiC single crystal grows on the seed crystal 10.

In the present embodiment, the principal surface 10a of the seed crystal 10 is brought into contact with the Si—C solution 11 stored in the crucible 7 (see FIG. 4). Thereafter, the principal surface 10a is detached from the Si—C solution 11, thereby leading to a state in which an Si—C solution 12 is adhered to a partial region of the principal surface 10a (see FIG. 4B, in which the moving direction of the seed crystal 10 with respect to the Si—C solution 11 is shown by an arrow)(step A-1a). Although step A-1a may be carried out, for example, with the principal surface 10a being kept horizontal, it may also be carried out with the principal surface 10a being inclined with respect to the horizontal plane.

To bring the principal surface 10a into contact with the Si—C solution 11, at least one of the seed crystal 10 and the Si—C solution 11 is moved such that the seed crystal 10 and the Si—C solution 11 come closer to each other. To detach the principal surface 10a from the Si—C solution 11, at least one of the seed crystal 10 and the Si—C solution 11 is moved such that the seed crystal 10 and the Si—C solution 11 are separated.

Although the Si—C solution 12 adheres as a thin liquid film to the whole surface of the principal surface 10a immediately after the principal surface 10a is detached from the Si—C solution 11, this Si—C solution 12 will soon gather into a part of the principal surface 10a. This results in a state in which the Si—C solution 12 which protrudes into a crest shape is adhered to a partial region (generally, in one place) of the principal surface 10a. A bubble 13 (see FIG. 4A) may be trapped between the principal surface 10a and the Si—C solution 11 while the principal surface 10a is in contact with the Si—C solution 11. However, after the principal surface 10a is detached from the Si—C solution 11, there is no bubble present between the Si—C solution 12, which has gathered into a part of the principal surface 10a, and the principal surface 10a (see FIG. 4B).

Next, at least one of the seed crystal 10 and the Si—C solution 11 is moved such that the seed crystal 10 and the Si—C solution 11 come closer to each other so that the Si—C solution 12 having adhered to a partial region of the principal surface 10a is brought into contact with the Si—C solution 11 (step A-1b). As a result, the Si—C solution 12 is connected to the Si—C solution 11 leading to a state in which a part (initial contact region) of the principal surface 10a is in contact with the Si—C solution 11 via the Si—C solution 12 which protrudes from the principal surface 10a (see FIG. 4C). At this moment, the principal surface is located higher than the liquid surface of the stored Si—C solution by an amount of height to which the Si—C solution that has gathered into a part of the principal surface protrudes.

Figure 4A:
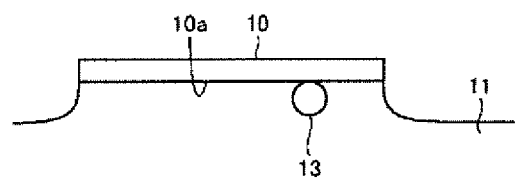
FIG. 4A is a side view to illustrate a production method of an SiC single crystal relating to a first embodiment of the present invention.
Figure 4B:
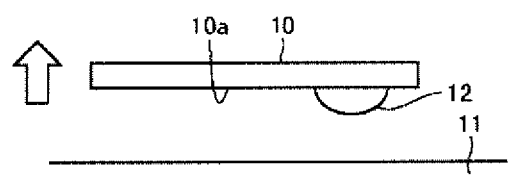
FIG. 4B is a side view to illustrate the production method of an SiC single crystal relating to the first embodiment of the present invention.
Figure 4C:
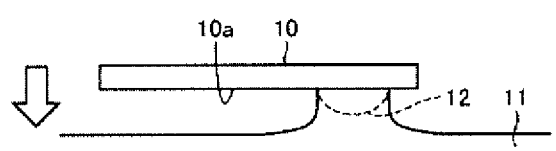
FIG. 4C is a side view to illustrate the production method of an SiC single crystal relating to the first embodiment of the present invention.
Figure 4D:
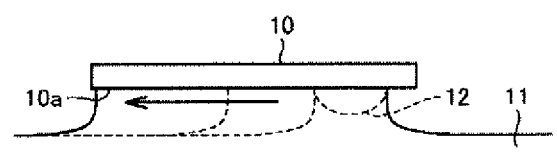
FIG. 4D is a side view to illustrate the production method of an SiC single crystal relating to the first embodiment of the present invention.

Thereafter, in the principal surface 10a, the contact region with the Si—C solution 11 (hereafter, referred to as a "solution contact region") quickly expands to the whole surface of the principal surface 10a starting from the initial contact region (see FIG. 4D, in which a dominant expansion direction of the solution contact region is shown by an arrow). This is due to a wetting phenomenon of the Si—C solution 11 against the principal surface 10a.

As the solution contact region expands, the atmospheric gas between the seed crystal 10 and the Si—C solution 11 is discharged sideward. As a result, the Si—C solution 11 comes into contact with the whole surface of the principal surface 10a without any bubble interposed therebetween. In this state, the SiC single crystal is grown on the principal surface 10a. The growth of SiC single crystal is performed while the principal surface 10a is kept horizontal.

During the growth of SiC single crystal, it is preferably arranged such that at least a portion adjacent to the seed crystal 10 in the Si—C solution 11 has a temperature slightly lower (for example, 0.5 to 5° C. lower) than the liquids temperature of that Si—C solution.

The SiC single crystal may be grown by a temperature difference method. In the temperature difference method, a temperature gradient is introduced in the Si—C solution 11 such that a low temperature part of the Si—C solution 11 is supersaturated in SiC, and the seed crystal 10 is brought into contact with this supersaturated portion. In this case, it is necessary that regarding the up-and-down direction, the vicinity of the liquid surface of the Si—C solution 11 is a low temperature part. The temperature gradient in the up-and-down direction of the Si—C solution 11 can be controlled by the heating means provided around the crucible. The temperature of the low temperature part may be further decreased in the Si—C solution 11 by disposing the cooling means in the vicinity of the liquid surface of the Si—C solution.

The Si—C solution 11 is heated by heat transfer from the heated crucible. On the other hand, heat is dissipated from the liquid surface of the Si—C solution 11. As a result, regarding the horizontal direction in the Si—C solution 11 in the vicinity of the liquid surface, the temperature of the Si—C solution 11 in the central part of the crucible becomes lower compared to that of the Si—C solution 11 adjacent to the wall face of the crucible. In this case, the seed crystal 10 is brought into contact with around the central part of the liquid surface of the Si—C solution 11.

When the seed crystal 10 is attached to the seed shaft, and the seed shaft is water cooled or air cooled, this temperature gradient in the horizontal direction further increases, and therefore the crystal growth rate increases. When the SiC single crystal is grown by the temperature difference method, the temperature gradient in the Si—C solution 11 is preferably in a range of 5 to 50° C./cm. When the temperature gradient is less than 5° C./cm, the degree of supersaturation in the lower temperature part decreases, and the driving force for crystal growth decreases. That is, in this case, the growth rate of SiC crystal decreases. When the temperature gradient is more than 50° C./cm, an SiC crystal is generated by spontaneous nucleation in the vicinity of the seed crystal 10, thus impairing uniform supply of solutes onto the seed crystal 10. Consequently, it becomes unable to obtain a crystal which has undergone uniform layer growth.

To make the SiC single crystal grow uniformly, it is preferable to rotate the Si—C solution 11 (crucible) as well as the seed crystal 10 (seed shaft). This rotation may be steady-state rotation or accelerating/decelerating rotation. Further, the rotational direction of the seed crystal 10 and the rotational direction of the Si—C solution 11 may be the same or opposite directions with respect to each other.

Since the production method of the present embodiment produces an SiC single crystal by a solution growth process, it can be practiced by a generally used production apparatus.

Second Embodiment

FIGS. 5A to 5E are side views to illustrate a production method of an SiC single crystal relating to a second embodiment. Components, which are the same as those shown in FIGS. 4A to 4D, are given the same reference symbols, thereby omitting description thereof.

In the production method of an SiC single crystal relating to the second embodiment, first, a seed crystal 10 is retained by a seed retaining part 14 with one of its surfaces (hereafter, referred to as a principal surface 10a) facing downward. The principal surface 10a is preferably arranged to be horizontal. The other surface of the seed crystal 10 is immobilized at the seed retaining part 14 with, for example, an adhesive. The seed retaining part 14 is, for example, a lower part of a column-shaped seed shaft 28.

The seed crystal 10 is disposed above the Si—C solution 11. Further, a bar-shaped solution contact member 15 is disposed along the vertical direction in the sideward of the seed crystal 10 and the seed retaining part 14, and above the Si—C solution 11 (see FIG. 5A). The solution contact member 15 is preferably made of a material having high wettability against the Si—C solution 11 and is made of, for example, graphite. The lower end of the solution contact member 15 is arranged to be lower than the lower end of the seed crystal 10.

Next, at least one of the solution contact member 15 and the Si—C solution 11 is moved such that the solution contact member 15 and the Si—C solution 11 come closer to each other. As a result, the lower end of the solution contact member 15 is brought into contact with the Si—C solution 11. When the solution contact member 15 is lowered, the seed crystal 10 along with the solution contact member 15 may be lowered while the lower end of the solution contact member 15 is kept lower than the lower end of the seed crystal 10.

Then, while keeping the contact between the solution contact member 15 and the Si—C solution 11, at least one of the solution contact member 15 and the Si—C solution 11 is moved such that the solution contact member 15 and the Si—C solution 11 are separated. As a result, the vicinity of the contact part with the solution contact member 15 is located higher than other portions in the liquid surface of the Si—C solution 11 (step A-2a; see FIG. 5B).

Figure 5A:
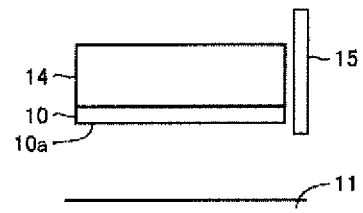
FIG. 5A is a side view to illustrate a production method of an SiC single crystal relating to a second embodiment of the present invention.
Figure 5B:
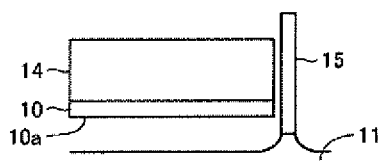
FIG. 5B is a side view to illustrate the production method of an SiC single crystal relating to the second embodiment of the present invention.
Figure 5C:
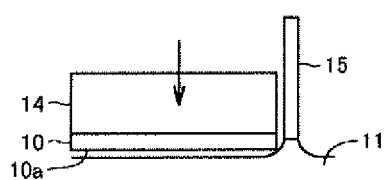
FIG. 5C is a side view to illustrate the production method of an SiC single crystal relating to the second embodiment of the present invention.
Figure 5D:
FIG. 5D is a side view to illustrate the production method of an SiC single crystal relating to the second embodiment of the present invention.

Next, at least one of the seed crystal 10 (seed retaining part 14) and the Si—C solution 11 is moved such that the seed crystal 10 and the Si—C solution 11 come closer to each other, thereby bringing the seed crystal 10 into contact with the above-described raised portion of liquid surface in the liquid surface of the Si—C solution 11 (step A-2b; see FIG. 5C; in which the moving direction of the seed crystal 10 with respect to the Si—C solution 11 is shown by an arrow). At this moment, the principal surface 10a is kept to be horizontal. As a result, a part of the edge part of the principal surface 10a first comes into contact with the above-described raised portion of liquid surface in the liquid surface of the Si—C solution 11. That is, in the present embodiment, the initial contact region is a region including a part of the edge part of the principal surface 10a. Further, at this moment, the center point of the principal surface is lower than the maximum height of the liquid surface of the stored Si—C solution.

When the solution contact member 15 has sufficiently high wettability against the Si—C solution 11, upon contact of the lower end of the solution contact member 15 with the Si—C solution 11, the Si—C solution 11 wets and spreads on the side face of the solution contact member 15. As a result, the vicinity of the solution contact member 15 is raised higher than other portions in the liquid surface of the Si—C solution 11. A part (initial contact region) of the principal surface 10a may be brought into contact with the raised portion of liquid surface. In this case, there is no need of carrying out the above-described step in which "while keeping the contact between the solution contact member 15 and the Si—C solution 11, at least one of the solution contact member 15 and the Si—C solution 11 is moved such that the solution contact member 15 and the Si—C solution 11 are separated".

When a part of the edge part of the principal surface 10a comes into contact with the raised portion of liquid surface of the Si—C solution 11, and the Si—C solution adheres thereto, the solution contact region expands due to a wetting phenomenon (see FIG. 5D; in which the expansion direction of the solution contact region is shown by an arrow), and consequently the whole surface of the principal surface 10a comes into contact with the Si—C solution 11. As the solution contact region expands, the atmospheric gas between the principal surface 10a and the Si—C solution 11 is discharged sideward. For this reason, there is no bubble present between the Si—C solution 11 and the principal surface 10a at the time when the solution contact region has spread over the whole surface of the principal surface 10a.

Figure 5E:
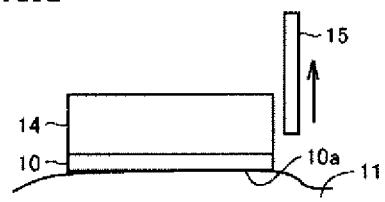
FIG. 5E is a side view to illustrate the production method of an SiC single crystal relating to the second embodiment of the present invention.

After the seed crystal 10 comes into contact with the Si—C solution 11, the solution contact member 15 may be detached from the Si—C solution 11 (see FIG. 5E). Thereafter, an SiC single crystal is grown on the principal surface 10a. At this moment, the SiC single crystal is grown while the principal surface 10a is kept to be horizontal.

Third Embodiment

FIGS. 6A to 6D are side views to illustrate a production method of an SiC single crystal relating to a third embodiment. Components, which are the same as those shown in FIGS. 4A to 4D and FIGS. 5A to 5E, are given the same reference symbols, thereby omitting description thereof.

In the production method of an SiC single crystal relating to the third embodiment, first, a seed crystal 10 is retained by a seed retaining part 14 with one of its surfaces (hereafter, referred to as a principal surface 10a) facing downward. In the present embodiment, the seed retaining part 14 is turnable around the horizontal axis (in the direction perpendicular to the paper surface in FIGS. 6A to 6D). By turning the seed retaining part 14, it is possible to put the seed crystal 10 retained by the seed retaining part 14 into a state in which the principal surface 10a is horizontal, and a state in which the principal surface 10a is inclined with respect to the horizontal plane.

Figure 6A:
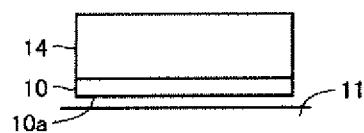
FIG. 6A is a side view to illustrate a production method of an SiC single crystal relating to a third embodiment of the present invention.

The seed crystal 10 retained by the seed retaining part 14 is disposed above the Si—C solution 11, and close to the Si—C solution 11(see FIG. 6A). The spacing between the Si—C solution 11 and the seed crystal 10 is, for example, 0.5 to 1 mm. Then, the seed retaining part 14 is turned, thereby causing the principal surface 10a to be inclined with respect to the horizontal plane. The angle to be formed between the principal surface 10a and the horizontal plane is, for example, more than 5°.

Figure 6B:
FIG. 6B is a side view to illustrate the production method of an SiC single crystal relating to the third embodiment of the present invention.

As a result, a part of the edge part of the principal surface 10a first comes into contact with the Si—C solution 11 (step A-3; see FIG. 6B). That is, in the present embodiment, the initial contact region is a part of the edge part of the principal surface 10a. At this moment, the height of the center point of the principal surface is larger than the height of the liquid surface of the stored Si—C solution.

Figure 6C:
FIG. 6C is a side view to illustrate the production method of an SiC single crystal relating to the third embodiment of the present invention.

The solution contact region starts expanding from the initial contact region due to a wetting phenomenon of the Si—C solution 11 against the principal surface 10a (see FIG. 6C; in which the expansion direction of the solution contact region is shown by an arrow). As the solution contact region expands, the atmospheric gas between the principal surface 10a and the Si—C solution 11 is discharged sideward. When the difference in height between the lowest portion and the highest portion in the inclined principal surface 10a is sufficiently small, the solution contact region expands until the whole surface of the principal surface 10a comes into contact with the Si—C solution 11. At the time when the solution contact region expands over the whole surface of the principal surface 10a, there is no bubble present between the Si—C solution 11 and the principal surface 10a.

Figure 6D:
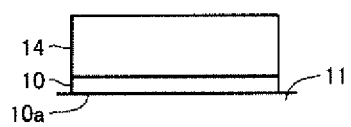
FIG. 6D is a side view to illustrate the production method of an SiC single crystal relating to the third embodiment of the present invention.

Thereafter, the seed retaining part 14 is turned to make the principal surface 10a horizontal (see FIG. 6D). Then, an SiC single crystal is grown on the principal surface 10a. The principal surface 10a is made horizontal after step A-3. Making the principal surface 10a horizontal may be performed either before or after the solution contact region expands over the whole surface of the principal surface 10a provided that it is after step A-3. The principal surface 10a during crystal growth may be substantially horizontal, and may also be inclined provided that it is less than 0.5°. As a result, for example, even if a temperature gradient is formed in the up-and-down direction of the Si—C solution, an SiC single crystal can uniformly be grown.

In the above-described example, the principal surface 10a is brought into contact with the Si—C solution 11 by inclining the principal surface 10a with respect to the horizontal plane. However, after the seed crystal 10 is sufficiently separated from the liquid surface of the Si—C solution 11 and the principal surface 10a is inclined with respect to the horizontal plane, at least one of the seed crystal 10 and the Si—C solution 11 may be moved such that the seed crystal 10 and the Si—C solution 11 come closer to each other, thereby bringing the seed crystal 10 into contact with the Si—C solution 11. In this case as well, as a result of that the principal surface 10a is inclined with respect to the horizontal plane, a part of the edge part of the principal surface 10a first comes into contact with the Si—C solution 11. Thereafter, the solution contact region expands over the whole surface of the principal surface 10a.

EXAMPLES

<Test No. 1>

As an example according to the production method of the above-described first embodiment (see FIGS. 4A to 4D), an SiC single crystal was produced.

A production apparatus used for producing an SiC single crystal had a configuration shown in FIG. 3, which included a graphite crucible (crucible 7), a heat insulation material (heat insulation member 16), a high frequency coil (heating apparatus 18), a stainless chamber (chamber 6), a seed retaining part (lower end part of the seed shaft 28).

Prior to producing an SiC single crystal, a relative positional relationship between the graphite crucible and the high frequency coil was adjusted such that a desired temperature gradient was formed in the Si—C solution 11 accommodated in the graphite crucible. The temperature gradient of the Si—C solution 11 was arranged such that its upper part and the central part were low temperature parts. In the Si—C solution 11, the temperature gradient of the low temperature part was determined by inserting a thermocouple into the Si—C solution and performing temperature measurement. In the Si—C solution 11, when the temperature in the vicinity of the liquid surface of the low temperature part was 1940° C., the temperature gradient of the low temperature part was 15° C./cm.

The method of producing the SiC single crystal was as follows. First, a raw material consisted of Si and Cr in a proportion of 0.6:0.4 (in molar ratio), with the balance being impurities was charged into the graphite crucible. Next, the atmosphere in the stainless chamber was replaced by He (helium) gas. Thereafter, the graphite crucible was heated by the high frequency coil to liquefy the raw material, thereby generating a raw material melt. The heating was continued for 1 hour, with the portion to be in contact with the seed crystal 10 (portion corresponding to the low temperature part of the Si—C solution 11) being kept at a temperature of 1940° C. in the raw material melt. As a result, C dissolved into the raw material melt from the graphite crucible, and an Si—C solution 11 having a concentration close to saturation in SiC was generated.

As the seed crystal 10, an SiC single crystal of 4H polymorph, having a circular plate shape of a diameter of 2 inches (about 51 mm) was prepared. One surface (principal surface 10a) of the seed crystal 10 was an on-axis (0 0 0-1) plane. The seed crystal 10 was immobilized at the under face of the seed retaining part (under face of the seed shaft 28) made of graphite with an adhesive such that the principal surface 10a faces downward and is horizontal.

Keeping the temperature of the vicinity of the liquid surface in the low temperature part of the Si—C solution 11 at 1940° C., and the temperature gradient of the lower temperature part at a 15° C./cm, the seed crystal 10 was lowered to come into contact with the low temperature part. Whether or not the seed crystal 10 and the Si—C solution 11 were in contact with each other was confirmed by the presence or absence of electric conduction between the seed retaining part and the graphite crucible.

After the seed crystal 10 was brought into contact with the Si—C solution 11, the seed crystal 10 was pulled upward to be detached from the Si—C solution (step A-1a). In the present example, regarding the height of the seed crystal 10 with respect to the liquid surface of the Si—C solution 11, the seed crystal 10 was detached from the Si—C solution 11 at a position where it was pulled up 7 mm from the position where it came into contact with the Si—C solution 11.

Thereafter, the seed crystal 10 was lowered again to bring the seed crystal 10 into contact with the Si—C solution 11 again (step A-1b). At this moment, the seed crystal 10 came into contact with the Si—C solution 11 at a position about 1 mm higher than the position where the seed crystal 10 first came into contact with the Si—C solution 11 (hereafter, referred to as a "first liquid-touch height"). This is considered to be because after the seed crystal 10 was detached from the Si—C solution 11, the protrusion height from the principal surface 10a of the Si—C solution 12 (see FIG. 4B) which had adhered to the principal surface 10a of the seed crystal 10 was about 1 mm. The seed crystal 10 coming into contact with the Si—C solution 11 again means that the Si—C solution 12 adhered to the principal surface 10a came into contact with the Si—C solution 11 accommodated (stored) in the graphite crucible.

Next, the seed crystal 10 was lowered to a position which was 0.5 mm lower from the position where the seed crystal 10 came into contact with the Si—C solution 11 again, to start growing of the SiC crystal. The growth time of crystal was 10 hours. Thereafter, the seed crystal 10 was moved upward to be detached from the Si—C solution 11. Then, after the graphite crucible was cooled to the room temperature, the seed crystal 10, and the SiC crystal which had grown on the seed crystal 10 were retrieved from the seed retaining part.

<Test No. 2>

An SiC crystal was grown under the same conditions as in Test No. 1 excepting that the diameter of the seed crystal 10 was 3 inches (about 76 mm), and the seed retaining part was sized to correspond to the seed crystal 10.

<Test No. 3>

An SiC crystal was grown under the same conditions as in Test No. 1 excepting that the composition of the raw material, which was liquefied to generate the Si—C solution 11, consisted of Si and Ti in a proportion of 0.78:0.22 (in molar ratio), with the balance being impurities.

<Test No. 4>

After the seed crystal 10 came into contact with the Si—C solution 11, the growth of SiC crystal was started without detaching the seed crystal 10 from the Si—C solution 11. The growth of SiC crystal was performed at a position which was 1 mm higher than the position where the seed crystal 10 came into contact with the Si—C solution 11. Excepting these conditions, an SiC crystal was grown under the same conditions as in Test No. 1. That is, in Test No. 4, step A-1a and step A-1b were not carried out.

<Test No. 5>

After the seed crystal 10 came into contact with the Si—C solution 11, the growth of SiC crystal was started without detaching the seed crystal 10 from the Si—C solution 11. The growth of SiC crystal was performed at a position which was 1 mm higher than the position where the seed crystal 10 came into contact with the Si—C solution 11. Excepting these conditions, an SiC crystal was grown under the same conditions as in Test No. 2. That is, in Test No. 5, step A-1a and step A-1b were not carried out.

<Evaluation>

The seed crystal 10, and the SiC crystal which had grown thereon were observed by a transmission type optical microscope by transmitting light through them in the thickness direction thereof to investigate the presence or absence of voids in the crystal. Since there was no void present in the seed crystal 10, when a void was observed in the seed crystal 10 and the SiC crystal which had grown thereon, it was seen that a void was present in the SiC crystal which has grown on the seed crystal 10. Table I shows growth conditions of SiC crystal, and evaluation results for Test Nos. 1 to 5.

TABLE 1

| | SiC crystal growth conditions | | |
|---|---|---|---|
| Test No. | Solution composition (molar ratio) | Diameter of seed crystal | Evaluation result |
| 1 | 0.6Si—0.4Cr | 2 inches | E |
| 2 | 0.6Si—0.4Cr | 3 inches | E |
| 3 | 0.78Si—0.22Cr | 2 inches | E |
| 4 | 0.6Si—0.4Cr | 2 inches | NA |
| 5 | 0.6Si—0.4Cr | 3 inches | NA |

Evaluation result
E: No void was observed.
NA: At least one void was observed.

No void at all was observed in any of the SiC crystals obtained by the production methods of Test Nos. 1 to 3. From this result, it is considered that in any of Test Nos. 1 to 3, there was no bubble between the Si—C solution 11 and the seed crystal 10 during crystal growth.

On the other hand, in the SiC crystals obtained by the production methods of Test Nos. 4 and 5, a void was observed in each of them. Since step A-1a and step A-1b were not carried out in both Test Nos. 4 and 5, it was considered that a bubble got trapped between the Si—C solution 11 and the seed crystal 10 (principal surface 10a) when the seed crystal 10 came into contact with the Si—C solution 11, and this bubble was present even during crystal growth.

<Reference Example>

An experiment corresponding to the above-descried embodiment 2 (see FIGS. 5A to 5E) was conducted by using water of room temperature in place of the Si—C solution 11, and a crucible made of transparent glass as the crucible. Here, contact condition between the seed crystal and water was observed.

A bar (circular column) shaped solution contact member 15 made of graphite was attached to a machine shaft which was movable up and down independent from the seed retaining part. The diameter of the solution contact member 15 was 1 mm. The solution contact member 15 was disposed above the water, on the side of the seed crystal 10 retained by the seed retaining part, and spaced apart 2 mm from the seed crystal 10. The lower part of the solution contact member 15 was protruded about 1 mm downward from the lower end of the seed crystal 10.

Next, the seed crystal 10 and the solution contact member 15 were lowered at the same speed. After the lower end of the solution contact member 15 came into contact with the water surface, the solution contact member 15 was pulled up by 30 mm. As a result of this operation, it was confirmed that the whole surface of the principal surface 10a of the seed crystal 10 came into contact with water through the states shown in FIGS. 5A to 5E.

REFERENCE SIGNS LIST

10: Seed crystal
10a: Principal surface
11, 12: Si—C solution

The invention claimed is:

1. A production method of an SiC single crystal by a solution growth process in which a principal surface of a seed crystal is arranged to face downward and brought into contact with an Si—C solution, thereby making an SiC single crystal grow on the principal surface, wherein
the principal surface is flat, and
the production method comprises:
a contact step A of bringing a partial region of the principal surface into contact with a stored Si—C solution;
a contact step B of leaving a contact region between the principal surface and the stored Si—C solution to expand, due to a wetting phenomenon, starting from an initial contact region which is the partial region brought into contact in the contact step A; and
a growth step of making an SiC single crystal grow on the principal surface which is in contact with the stored Si—C solution.

2. The production method according to claim 1, wherein the contact step A comprises:
a step A-1a of bringing the principal surface into contact with the stored Si—C solution, and thereafter detaching the principal surface from the stored Si—C solution, thereby leading to a state in which the Si—C solution adheres to a partial region of the principal surface; and
a step A-1b of bringing the Si—C solution having adhered to the partial region of the principal surface into contact with the stored Si—C solution.

3. The production method according to claim 1, wherein the contact step A comprises:
a step A-2a of bringing a solution contact member into contact with the stored Si—C solution, thereby raising a portion in a vicinity of the solution contact member to be higher than other portions in a liquid surface of the stored Si—C solution; and
a step A-2b of bringing a partial region of the principal surface into contact with the raised portion of the liquid surface in the stored Si—C solution.

4. The production method according to claim 1, wherein the contact step A comprises:
a step A-3 of inclining the principal surface with respect to a horizontal plane, and bringing a partial region of the principal surface into contact with the stored Si—C solution; and
a growth step of making the SiC single crystal grow with the principal surface being kept horizontal.

* * * * *